United States Patent
Punchihewa et al.

(10) Patent No.: US 9,893,086 B1
(45) Date of Patent: Feb. 13, 2018

(54) CONTACT PUNCH THROUGH MITIGATION IN SOI SUBSTRATE

(71) Applicant: GLOBALFOUNDRIES Inc., Grand Cayman (KY)

(72) Inventors: Kasun Anupama Gardiye Punchihewa, Ballston Lake, NY (US); Deepal Wehella-Gamage, Newburgh, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 48 days.

(21) Appl. No.: 15/352,654

(22) Filed: Nov. 16, 2016

(51) Int. Cl.
| | |
|---|---|
| *H01L 27/01* | (2006.01) |
| *H01L 27/12* | (2006.01) |
| *H01L 29/06* | (2006.01) |
| *H01L 29/45* | (2006.01) |
| *H01L 29/66* | (2006.01) |
| *H01L 21/311* | (2006.01) |
| *H01L 21/768* | (2006.01) |
| *H01L 21/84* | (2006.01) |
| *H01L 23/535* | (2006.01) |
| *H01L 29/08* | (2006.01) |
| *H01L 29/417* | (2006.01) |

(52) U.S. Cl.
CPC .... *H01L 27/1203* (2013.01); *H01L 21/31111* (2013.01); *H01L 21/76802* (2013.01); *H01L 21/76843* (2013.01); *H01L 21/76877* (2013.01); *H01L 21/84* (2013.01); *H01L 23/535* (2013.01); *H01L 29/0649* (2013.01); *H01L 29/0847* (2013.01); *H01L 29/41783* (2013.01); *H01L 29/456* (2013.01); *H01L 29/66545* (2013.01); *H01L 29/66568* (2013.01)

(58) Field of Classification Search
CPC ......... H01L 21/31111; H01L 21/76802; H01L 21/768432; H01L 21/76877; H01L 21/84; H01L 27/1203; H01L 29/0648; H01L 29/0847; H01L 29/41783; H01L 29/456; H01L 29/66545; H01L 29/66568
USPC ........................................................ 257/347
See application file for complete search history.

(56) References Cited

U.S. PATENT DOCUMENTS

| | | | |
|---|---|---|---|
| 7,294,890 B2 | 11/2007 | Lo et al. | |
| 2012/0126331 A1* | 5/2012 | Lin ................. | H01L 21/823418 257/369 |
| 2013/0015524 A1* | 1/2013 | Hsu .................... | H01L 21/28123 257/344 |

(Continued)

*Primary Examiner* — Kevin M Picardat
(74) *Attorney, Agent, or Firm* — Yuanmin Cai; Hoffman Warnick LLC (57) ABSTRACT

A method of forming a contact to mitigate punch through in SOI substrates is disclosed. The method may include providing an active region in SOI substrate isolated from another region in the SOI substrate by a shallow trench isolation (STI), the active region having a silicided source/drain region adjacent the STI. A spacer may be formed at an edge of the silicided source/drain region adjacent to the STI. A contact etch stop layer (CESL) may be deposited over the spacer and a dielectric layer over the CESL. A contact opening may be formed to the source/drain region through the CESL and the dielectric layer. A portion of the contact opening is positioned over the spacer such that the spacer prevents punch through into the STI. A contact may then be formed in the contact opening.

18 Claims, 4 Drawing Sheets

(56) References Cited

U.S. PATENT DOCUMENTS

| | | | |
|---|---|---|---|
| 2013/0295739 A1* | 11/2013 | Hsiao | H01L 29/66515 438/285 |
| 2016/0020141 A1* | 1/2016 | Posseme | H01L 21/76802 438/724 |
| 2016/0056232 A1* | 2/2016 | Kuo | H01L 29/0649 257/401 |
| 2016/0149007 A1* | 5/2016 | Chou | H01L 29/402 257/339 |
| 2017/0084721 A1* | 3/2017 | Hung | H01L 29/66795 |

* cited by examiner

CONTACT PUNCH THROUGH MITIGATION IN SOI SUBSTRATE

BACKGROUND

The present disclosure relates to semiconductor device fabrication, and more specifically, to methods of mitigating contact punch through in a semiconductor-on-insulator (SOI) substrate. Semiconductor-on-insulator technology (SOI) typically refers to the use of a layered semiconductor-insulator-semiconductor substrate in place of a more conventional semiconductor substrate (bulk substrate) in semiconductor manufacturing, especially microelectronics. SOI-based devices differ from conventional silicon-built devices in that the semiconductor junction is above an electrical insulator, typically silicon dioxide or (less commonly) sapphire. The choice of insulator depends largely on intended application, with sapphire being used for radiation-sensitive applications and silicon oxide preferred for improved performance and diminished short channel effects in microelectronics devices. The precise thickness of the insulating layer and topmost semiconductor-on-insulator (SOI) layer also vary widely with the intended application. SOI substrates are commonly used to form a large variety of devices such as: static random access memory (SRAM), clock synchronized RAM (CSRAM), logic devices, etc.

During formation of semiconductor devices, electrical contacts are formed through dielectric layers to electrically interconnect desired components with other components, e.g., source, drain or gates of a transistor. Each component is positioned within a selected layer within the semiconductor device that is covered by a dielectric. Typically, the contacts are formed by patterning a mask over the dielectric layer and etching to form an opening in the dielectric to the desired component therebelow. The opening is then filled with a liner and a conductor to form the contact. One challenge relative to forming contacts using SOI substrates is ensuring the contact opening does not extend into the layer below, which is referred to as "punch through." Punch through leads to the contact being in the wrong location and possibly making the device non-functional. Consequently, punch through can cause problems with yield during fabrication and/or performance degradation of the final device. The challenge of controlling punch through is magnified with smaller semiconductor devices, especially with current technology that is now creating wires smaller than 32 nanometers (nm). One approach to address punch through with SOI substrates is to control the etch selectivity of whatever etching technique is employed. This approach however is not always effective because, for example, it is difficult to effectively detect end points of the etching for the small contacts.

One type of punch through is referred to as "edge punch through" and refers to over-etching into a divot or recess next to a shallow trench isolation (STI) at the boundary of different regions of the substrate, e.g., between an active region and another region. STI is a form of isolation in which a trench is etched into the substrate and filled with an insulating material such as oxide, to isolate one region of the substrate from an adjacent region of the substrate. One or more transistors of a given polarity may be disposed within an area isolated by STI. Edge punch through can cause direct shorts to the underlying substrate.

SUMMARY

A first aspect of the disclosure is directed to a method of forming a contact, the method including: providing an active region in a semiconductor-on-insulator (SOI) substrate isolated from another region in the SOI substrate by a shallow trench isolation (STI), the active region having a silicided source/drain region adjacent the STI; forming a spacer at an edge of the silicided source/drain region adjacent to the STI; depositing a contact etch stop layer (CESL) over the spacer; forming a dielectric layer over the CESL; forming a contact opening to the silicided source/drain region through the CESL and the dielectric layer, wherein a portion of the contact opening is positioned over the spacer such that the spacer prevents punch through into the STI; and forming a contact in the contact opening.

A second aspect of the disclosure includes a method of forming a contact, the method including: providing an active region in a semiconductor-on-insulator (SOI) substrate isolated from another region in the SOI substrate by a shallow trench isolation (STI), the active region having a silicided source/drain region adjacent the STI; forming a spacer at an edge of the silicided source/drain region adjacent to the STI by: depositing a spacer material over the silicided source/drain region and the STI, anisotropically etching the spacer material, creating the spacer, and performing a post-etch clean; depositing a contact etch stop layer (CESL) over the spacer; forming a dielectric layer over the CESL; forming a contact opening to the source/drain region through the CESL and the dielectric layer, wherein a portion of the contact opening is positioned over the spacer such that the spacer prevents punch through into the STI; depositing a liner in the contact opening; depositing a conductor in the contact opening; and planarizing the conductor forming a contact in the contact opening.

A third aspect of the disclosure related to a semiconductor structure, including: a semiconductor-on-insulator (SOI) substrate; a shallow trench isolation (STI) isolating a silicided source/drain region in an active region of the SOI substrate from another region of the SOI substrate, the silicided source/drain region adjacent to the STI; a spacer at an edge of the silicided source/drain region adjacent to the STI; and a contact to the silicided source/drain region, wherein at least a portion of the contact lands over the spacer.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
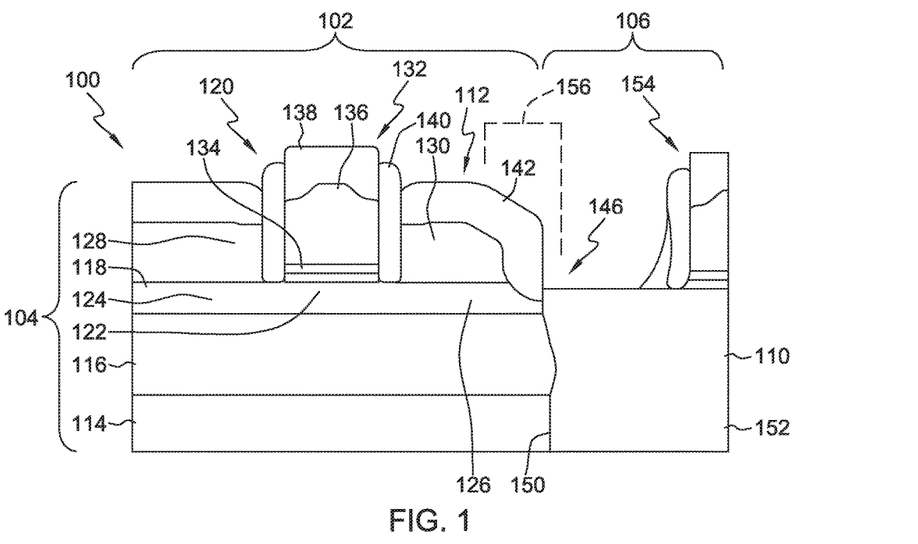
FIG. 1 shows a cross-sectional view of a preliminary structure and processes of a method according to embodiments of the disclosure.

Referring to the drawings, FIG. 1 shows a cross-sectional view of an initial structure 100 for a method of forming a contact 180 (FIG. 6) according to embodiments of the disclosure. At this stage, initial structure 100 is provided including an active region 102 in a semiconductor-on-insulator (SOI) substrate 104 isolated from another region in SOI substrate 104 by a shallow trench isolation (STI) 110. As illustrated, active region 102 includes a silicided source/drain region 112 adjacent STI 110. The other region may include any region over STI 110 or beyond STI 110 that includes devices requiring isolation from active region 102. Initial structure 100 may be provided using any now known or later developed semiconductor fabrication techniques.

SOI substrate 104 may include a semiconductor substrate 114, an insulator layer 116 and a semiconductor-on-insulator (SOI) layer 118. Semiconductor substrate 114 and SOI layer 118 may include but are not limited to silicon, germanium, silicon germanium, silicon carbide, and those consisting essentially of one or more III-V compound semiconductors having a composition defined by the formula $Al_{x1}Ga_{x2}In_{x3}As_{y1}P_{y2}N_{y3}Sb_{y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entirety of each layer may be strained. For example. SOI layer 118 (and/or epi layer thereover) may be strained.

Insulator layer 116 may include any now known or later developed dielectric used for SOI layers, such as but not limited to silicon dioxide or sapphire. As noted, the choice of insulator depends largely on intended, application, with sapphire being used for radiation-sensitive applications and silicon oxide preferred for improved performance and diminished short channel effects in microelectronics devices. The precise thickness of insulator layer 116 and topmost SOI layer 118 also vary widely with the intended application.

Active region 102 may include any region of SOI substrate 104 in which active devices are employed. In the instant example, a transistor 120 including silicided source/drain region 112 is formed in active region 102. Transistor 120 may otherwise include a channel region 122 in SOI layer 118 between source/drain regions 124, 126. Raised source/drain regions 128, 130 may be formed over source/drain regions 124, 126, e.g., by epitaxial growth of silicon germanium. As understood, regions 124, 126, 128, 130 may be doped, e.g., by ion implanting or in-situ as formed. As also known, a dopant element introduced into semiconductor can establish either p-type (acceptors) or n-type (donors) conductivity. Common dopants in silicon: for p-type—boron (B), indium (In); and for n-type—phosphorous (P) arsenic (As), antimony (Sb). Dopants are of two types—"donors" and "acceptors." N type implants are donors and P type are acceptors.

Transistor 120 may also include a gate 132 including one or more gate dielectric layers 134, including but not limited to: hafnium silicate (HfSiO), hafnium oxide ($HfO_2$), zirconium silicate ($ZrSiO_x$), zirconium oxide ($ZrO_2$), silicon oxide ($SiO_2$), silicon nitride ($Si_3N_4$), silicon oxynitride (SiON), high-k material or any combination of these materials. Gate 132 may also include a conductive body 136 (e.g., a metal such as copper or tungsten, or polysilicon), a silicide cap 138 and a spacer 140 thereabout. Spacer 140 may include any now known or later developed spacer material such as silicon nitride.

Silicide cap 138 on gate 132 and a silicide 142 of silicided source/drain region 112 may be formed using any now known or later developed technique, e.g., performing an in-situ pre-clean, depositing a metal such as titanium, nickel, cobalt, etc., annealing to have the metal react with silicon, and removing unreacted metal.

Initial structure 100 may be formed using any now known or later developed semiconductor fabrication techniques including by not limited to photolithography (and/or as sidewall image transfer (SIT)). In lithography (or "photolithography"), a radiation sensitive "resist" coating is formed. e.g., deposited, over one or more layers which are to be treated, in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The patterned resist can then serve as a mask for the underlying layers which can then be selectively treated, such as to receive dopants and/or to undergo etching, for example.

Where materials are deposited, "depositing" may include any now known or later developed techniques appropriate for the material to be deposited including but not limited to: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

With further regard to the method of forming a contact according to embodiments of the disclosure, STI 110 may include a trench 150 etched into SOI substrate 104 (e.g., by RIE) and filled with an insulating material 152 such as silicon oxide, to isolate active region 102 of SOI substrate 104 from an adjacent region (over and to right of STI 110) of the substrate. Part of a dummy gate 154 is shown over STI 110, and may be provided as part of initial structure 100.

At this stage in conventional processing, a contact etch stop layer (CESL) would be formed over initial structure 100 followed by an interlayer dielectric layer over the CESL. A contact opening mask would then be formed and used to etch a contact opening 156 (shown in phantom) to silicided source/drain region 112. At least a portion of the contact opening frequently overlaps an edge 146 between active region 102, and more particularly, silicided source/drain region 112, and STI 110, causing the contact opening to exhibit "edge punch through" relative to STI 110. As noted, when the contact is eventually formed, the edge punch through can create direct shorts to SOI substrate 104, which at the very least negatively impacts performance and can render the device inoperative. It is noted that while edge 146 is shown as a clean line between STI 110 and silicided source/drain region 112, some residue. e.g., oxide and/or nitride, from earlier processing may exist. This residue, however, does not provide any meaningful structure or impact the contact opening forming.

Figure 2:
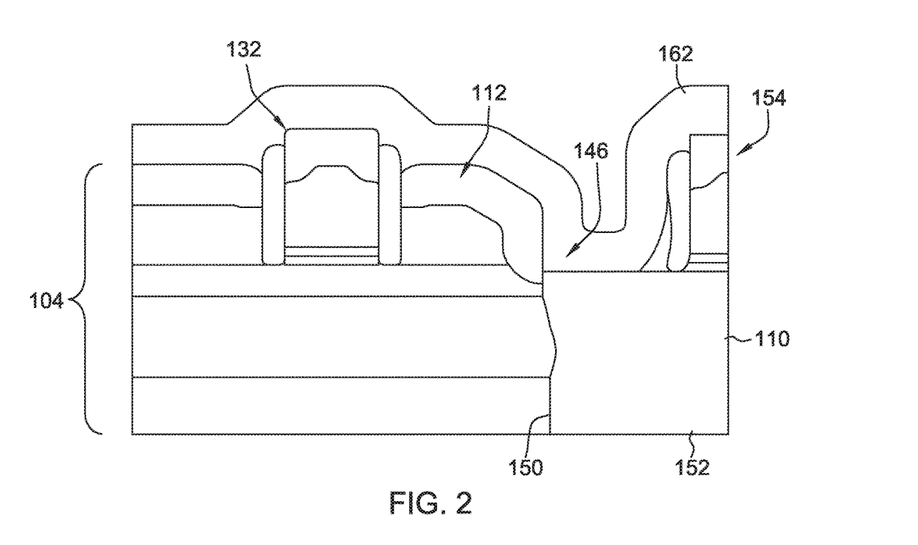
FIG. 2 shows a cross-sectional view of processes of a method according to embodiments of the disclosure.
Figure 3:
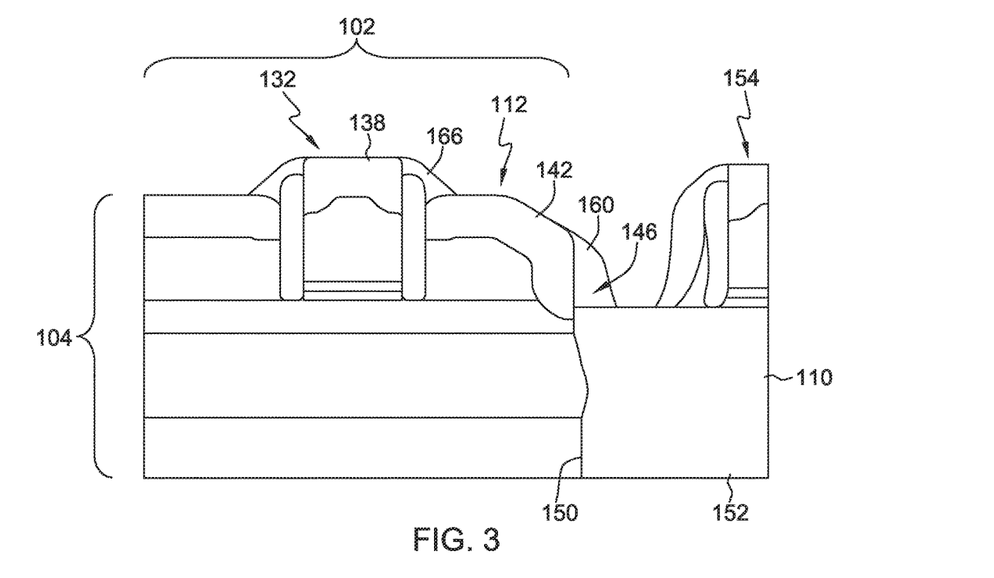
FIG. 3 shows a cross-sectional view of processes of a method according to embodiments of the disclosure.

In contrast to conventional processing, as shown in FIGS. 2 and 3, embodiments of the disclosure include forming a spacer 160 (FIG. 3) at edge 146 of active region 102, and in particular, silicided source/drain region 112, adjacent to STI 110. Spacer 160 may also be referred to as a wing spacer. In one embodiment, spacer 160 forming may include depositing a spacer material 162 (FIG. 2) over silicided source/drain region 112 and STI 110. Spacer material 162 may include any now known or later developed spacer material such as silicon nitride. The thickness of spacer material 162 may vary depending on technology node employed, but in one example may have a thickness of approximately 10 to approximately 20 nanometers. In another example, spacer material 162 may have a thickness of approximately 15 nanometers. FIG. 3 shows anisotropically etching spacer material 162, creating spacer 160. As also shown in FIG. 3, a post-etch cleaning may also be performed. As shown in FIG. 3, spacer 160 covers and protects edge 146 between silicided source/drain region 112 and STI 110, mitigating punch through as will be described. FIG. 3 also shows additional spacers 166 formed around silicide cap 138 formed by spacer material 162, but this is not necessary in all instances.

Figure 4:
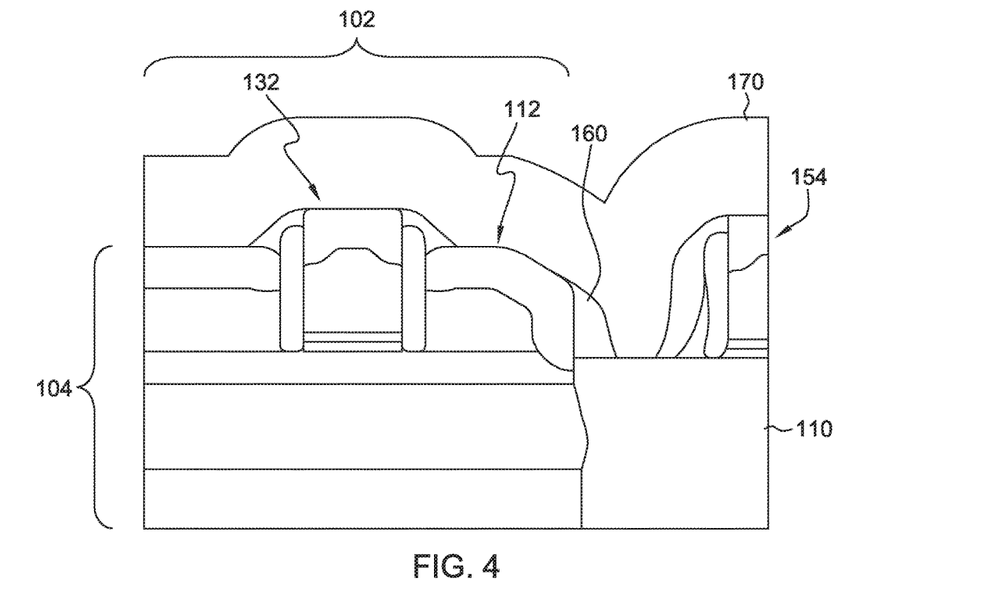
FIG. 4 shows a cross-sectional view of processes of a method according to embodiments of the disclosure.

FIG. 4 shows depositing a contact etch stop layer (CESL) 170 over spacer 160. CESL 170 may include any now known or later developed etch stop material such as silicon nitride. In one embodiment. CESL 170 includes a stress therein, e.g., compressive or tensile, so as to impart a strain to at least part of active region 102, in a known fashion.

Figure 5:
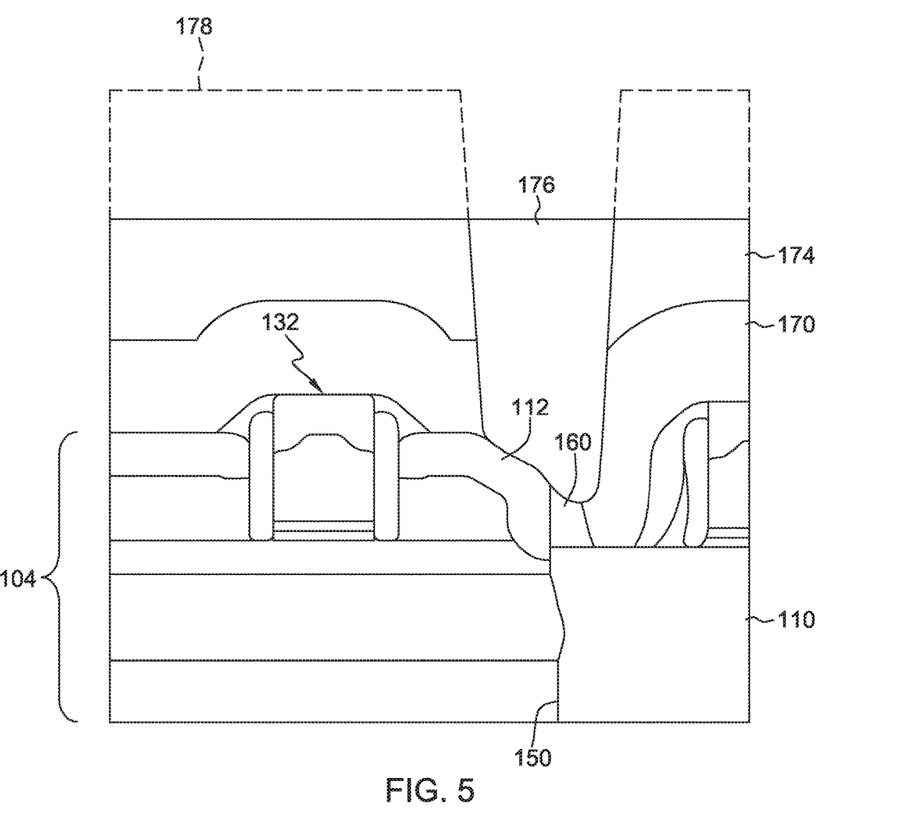
FIG. 5 shows a cross-sectional view of processes of a method according to embodiments of the disclosure.

FIG. 5 shows forming a dielectric layer 174 over CESL 170. e.g., by deposition. Dielectric layer 174 may include may include any interlevel or intralevel dielectric material including inorganic dielectric materials, organic dielectric materials, or combinations thereof. Suitable dielectric materials include but are not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell). JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning).

FIG. 5 also shows forming a contact opening 176 to silicided source/drain region 112 through CESL 170 and dielectric layer 174. Contact opening 176 may be formed using photolithography. i.e., with a mask 178 (in phantom) which can be removed in a conventional manner once opening 176 is formed. As illustrated, a portion of contact opening 176 is positioned over spacer 160 such that the spacer prevents punch through into STI 110. In this fashion, spacer 160 accommodates mis-alignment of contact opening 176 with silicided source/drain region 112 or oversizing of contact opening 176, and prevents punch through into STI 110.

Figure 6:
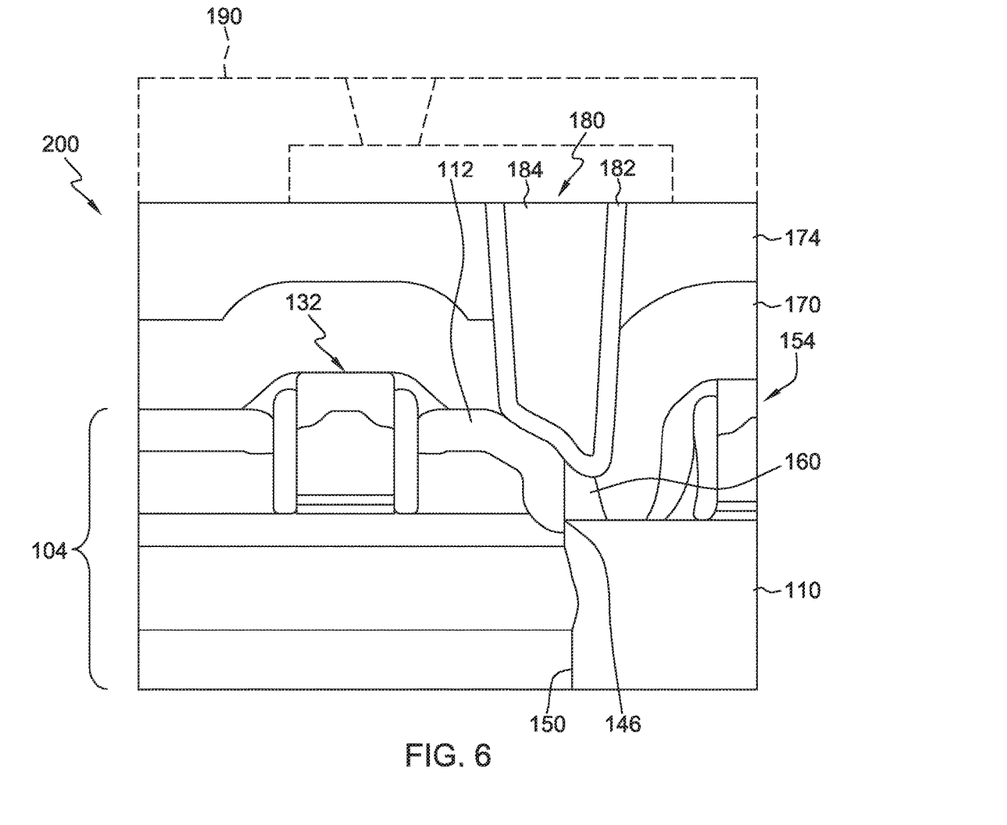
FIG. 6 shows a cross-sectional view of processes of a method and a semiconductor structure according to embodiments of the disclosure.

FIG. 6 shows forming a contact 180 in contact opening 176. Contact 180 forming may include depositing a liner 182 in contact opening 176, then depositing a conductor 182 in contact opening 176 and planarizing the conductor. Liner 182 may include any conventional liner material such as ruthenium; however, other refractory metals such as tantalum (Ta), titanium (Ti), tungsten (W), iridium (Ir), rhodium (Rh) and platinum (Pt), etc., or mixtures of thereof, may also be employed. Conductor 182 may include, for example, copper or tungsten. The planarizing can be carried out using any now known or later developed technique such as but not limited to chemical mechanical planarization (CMP). FIG. 6 also shows, in phantom, conventional forming of back-end-of-line (BEOL) interconnects 190 to contact 180.

It is emphasized that method of forming contact 180 may include any variety of intermediate steps not described herein but understood with those with skill on the art.

FIG. 6 shows a semiconductor structure 200 according to embodiments of the disclosure. Semiconductor structure 200 includes SOI substrate 104 with STI 110 isolating silicided source/drain region 112 in active region 102 of the SOI substrate from another region (over STI and beyond to right) of the SOI substrate. Silicided source/drain region 112 is adjacent to STI 110, and has edge 146 therewith. Spacer 160 is positioned at edge 146 of silicided source/drain region 112 adjacent to STI 110, and prevents edge punch through as described herein. Spacer may include, for example, silicon nitride. Semiconductor structure 200 also includes contact 180 to silicided source/drain region 112. Silicided source/drain region 180 may include raised source/drain regions 128, 130 (FIG. 1), extending adjacent gate 132. As shown, at least a portion of contact 180 lands over spacer 160—the rest lands on silicided source/drain region 112. CESL 170 is adjacent spacer 160 and over STI 110, and dielectric layer 174 is over CESL 170. A dummy gate 154 may be provided over STI 110. Spacer 160 may have a thickness of, for example, approximately 10 to approximately 20 nanometers, but may vary depending on the technology node. In another example, spacer 160 may have a thickness of approximately 15 nanometers, but in any event has a thickness such that no gap exists therebelow.

The methods of forming a contact herein provide a cost effective manner of mitigating edge punch through with no additional masks and with minor additional processing involved. The additional processing steps do not significantly increase processing time.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a". "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming a contact, the method comprising:
providing an active region in a semiconductor-on-insulator (SOI) substrate isolated from another region in the SOI substrate by a shallow trench isolation (STI), the active region having a silicided source/drain region adjacent the STI;
forming a spacer at an edge of the silicided source/drain region and the STI, wherein the spacer covers the edge of the silicided source/drain region and the STI the forming of the spacer including:
depositing a spacer material over the silicided source/drain region and the STI;
anisotropically etching the spacer material, to creating the spacer; and
performing a post-etch clean on the spacer;
depositing a contact etch stop layer (CESL) over the spacer;
forming a dielectric layer over the CESL;
forming a contact opening to the silicided source/drain region through the CESL and the dielectric layer, wherein a portion of the contact opening is positioned over the spacer such that the spacer prevents punch through into the STI; and
forming a contact in the contact opening.

2. The method of claim 1, wherein the spacer material has a thickness of approximately 10 to approximately 20 nanometers.

3. The method of claim 2, wherein the spacer material has a thickness of approximately 15 nanometers.

4. The method of claim 1, further comprising forming back-end-of-line (BEOL) interconnects to the contact.

5. The method of claim 1, wherein the contact forming includes depositing a liner in the contact opening, depositing a conductor in the contact opening and planarizing the conductor.

6. The method of claim 1, wherein the providing includes providing a dummy gate over the STI.

7. The method of claim 1, wherein the CESL includes a stress therein.

8. A method of forming a contact, the method comprising:
providing an active region in a semiconductor-on-insulator (SOI) substrate isolated from another region in the SOI substrate by a shallow trench isolation (STI), the active region having a silicided source/drain region adjacent the STI;
forming a spacer at an edge of the silicided source/drain region and the STI, wherein the spacer covers the edge of the silicided source/drain region and the STI, the forming of the spacer including:
depositing a spacer material over the silicided source/drain region and the STI;
anisotropically etching the spacer material, to create the spacer; and
performing a post-etch clean on the spacer;
depositing a contact etch stop layer (CESL) over the spacer, forming a dielectric layer over the CESL;

forming a contact opening to the source/drain region through the CESL and the dielectric layer, wherein a portion of the contact opening is positioned over the spacer such that the spacer prevents punch through into the STI;

depositing a liner in the contact opening;

depositing a conductor in the contact opening; and planarizing the conductor forming a contact in the contact opening.

9. The method of claim 8, further comprising forming back-end-of-line (BEOL) interconnects to the contact.

10. The method of claim 8, wherein the providing includes providing a dummy gate over the STI.

11. The method of claim 8, wherein the spacer material has a thickness of approximately 10 to approximately 20 nanometers.

12. The method of claim 11, wherein the spacer material has a thickness of approximately 15 nanometers.

13. A semiconductor structure, comprising:

a semiconductor-on-insulator (SOI) substrate;

a shallow trench isolation (STI) isolating a silicided source/drain region in an active region of the SOI substrate from another region of the SOI substrate, the silicided source/drain region adjacent to the STI;

a dummy gate over the STI;

a spacer at an edge of the silicided source/drain region and the STI wherein the spacer covers the edge of the silicided source/drain region and the STI and the spacer is spaced from the dummy gate; and a contact to the silicided source/drain region, wherein at least a portion of the contact lands over the spacer.

14. The semiconductor structure of claim 13, further comprising a contact etch stop layer adjacent the spacer and over the STI, and a dielectric layer over the CESL.

15. The semiconductor structure of claim 13, wherein the spacer includes silicon nitride.

16. The semiconductor structure of claim 13, wherein the silicided source/drain region include a raised source/drain region.

17. The semiconductor structure of claim 13, wherein the spacer has a thickness of approximately 10 to approximately 20 nanometers.

18. The semiconductor structure of claim 17, wherein the spacer has a thickness of approximately 15 nanometers.

* * * * *